(12) United States Patent
Ha et al.

(10) Patent No.: US 12,321,198 B2
(45) Date of Patent: Jun. 3, 2025

(54) DISPLAY DEVICE AND METHOD OF MANUFACTURING THE SAME

(71) Applicant: Samsung Display Co., LTD., Yongin-si (KR)

(72) Inventors: Seunghwa Ha, Cheongju-si (KR); Juyeop Seong, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 219 days.

(21) Appl. No.: 18/076,509

(22) Filed: Dec. 7, 2022

(65) Prior Publication Data

US 2023/0288961 A1  Sep. 14, 2023

(30) Foreign Application Priority Data

Mar. 11, 2022 (KR) .................. 10-2022-0031015

(51) Int. Cl.
    *G06F 1/16*     (2006.01)
    *H04M 1/02*     (2006.01)

(52) U.S. Cl.
    CPC ........ *G06F 1/1652* (2013.01); *H04M 1/0268* (2013.01)

(58) Field of Classification Search
    CPC ..... G06F 1/1652; H04M 1/0268; G09F 9/301
    See application file for complete search history.

(56) References Cited

U.S. PATENT DOCUMENTS

| | | | | |
|---|---|---|---|---|
| 10,798,831 B2 * | 10/2020 | Shin | ..................... | H05K 5/0217 |
| 11,003,219 B1 * | 5/2021 | Kim | ..................... | G06F 1/1652 |
| 11,199,876 B2 * | 12/2021 | Lee | ..................... | H04M 1/0237 |
| 12,156,350 B2 * | 11/2024 | Park | ..................... | G09F 9/301 |
| 2018/0103552 A1 * | 4/2018 | Seo | ..................... | H05K 5/0017 |
| 2018/0124931 A1 * | 5/2018 | Choi | ..................... | G09F 9/301 |
| 2019/0025945 A1 * | 1/2019 | Lindblad | ..................... | G06F 3/0412 |
| 2022/0399521 A1 * | 12/2022 | Kang | ..................... | B32B 3/30 |
| 2023/0185340 A1 * | 6/2023 | Yun | ..................... | G06F 1/1652 361/679.27 |

(Continued)

FOREIGN PATENT DOCUMENTS

| | | | | |
|---|---|---|---|---|
| EP | 3842895 A1 * | 6/2021 | ........... | G06F 1/1624 |
| KR | 10-2016-0141255 | 12/2016 | | |

(Continued)

*Primary Examiner* — Nidhi Thaker

(74) *Attorney, Agent, or Firm* — KILE PARK REED & HOUTTEMAN PLLC

(57) ABSTRACT

A display device includes a plate including a first area and a second area adjacent to the first area and including pattern portions defining an opening pattern and segment portions disposed between the pattern portions, respectively, a display module including a flat portion disposed in the first area on the plate, and a bendable portion extending from the flat portion and disposed in the second area on the plate, segment members disposed in the second area under the plate and respectively overlapping the segment portions in a direction, first filling members disposed under the plate, disposed between the segment members, respectively overlapping the pattern portions in the direction, and having a first elastic modulus and second filling members respectively disposed under the first filling members, respectively overlapping the first filling members in the direction, and having a second elastic modulus different from the first elastic modulus.

12 Claims, 17 Drawing Sheets

(56) References Cited

U.S. PATENT DOCUMENTS

| | | | |
|---|---|---|---|
| 2023/0205272 A1* | 6/2023 | Park | G06F 1/1624 361/679.01 |
| 2024/0153418 A1* | 5/2024 | Ha | H05K 7/18 |

FOREIGN PATENT DOCUMENTS

| KR | 10-2018-0040181 | 4/2018 |
|---|---|---|
| KR | 10-2019-0062855 | 6/2019 |
| KR | 10-1995045 | 7/2019 |
| KR | 10-2020-0084980 | 7/2020 |
| KR | 10-2020-0099054 | 8/2020 |

\* cited by examiner

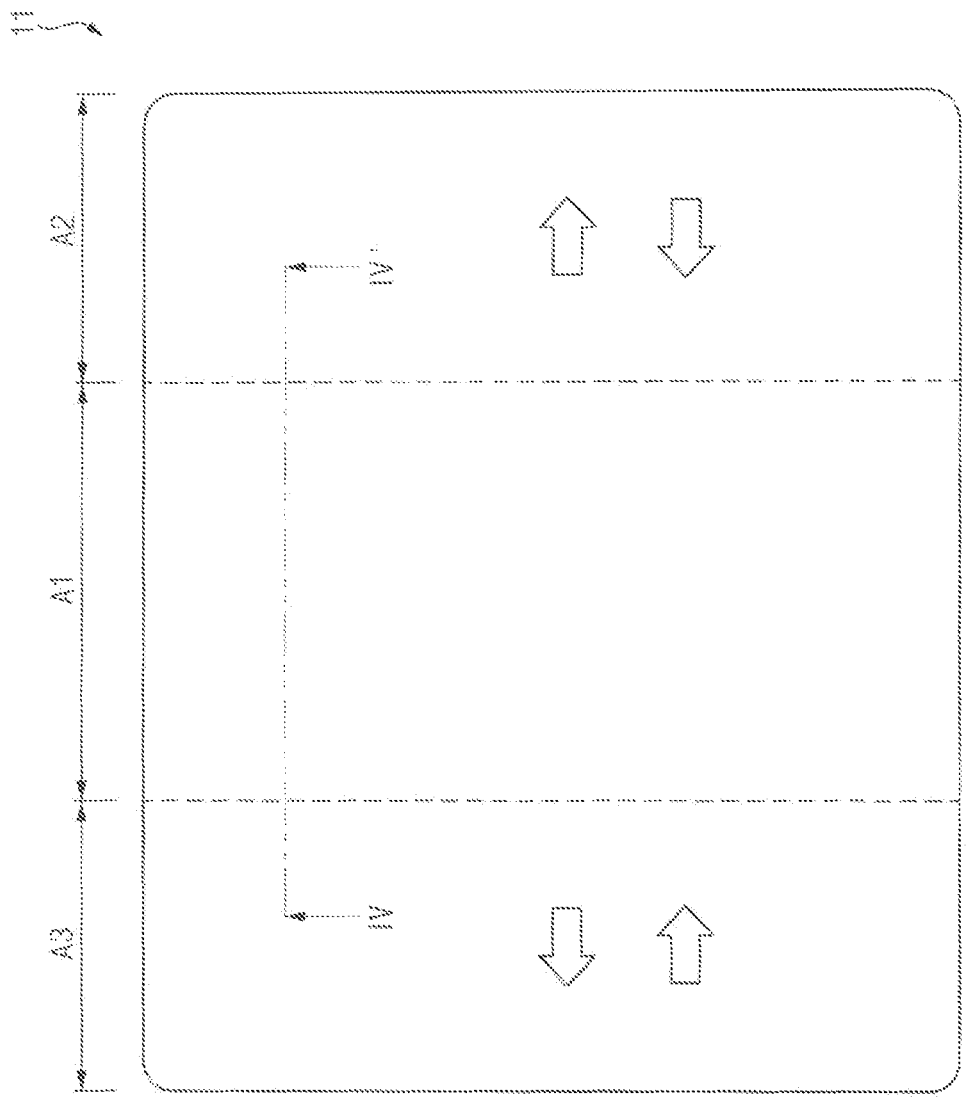

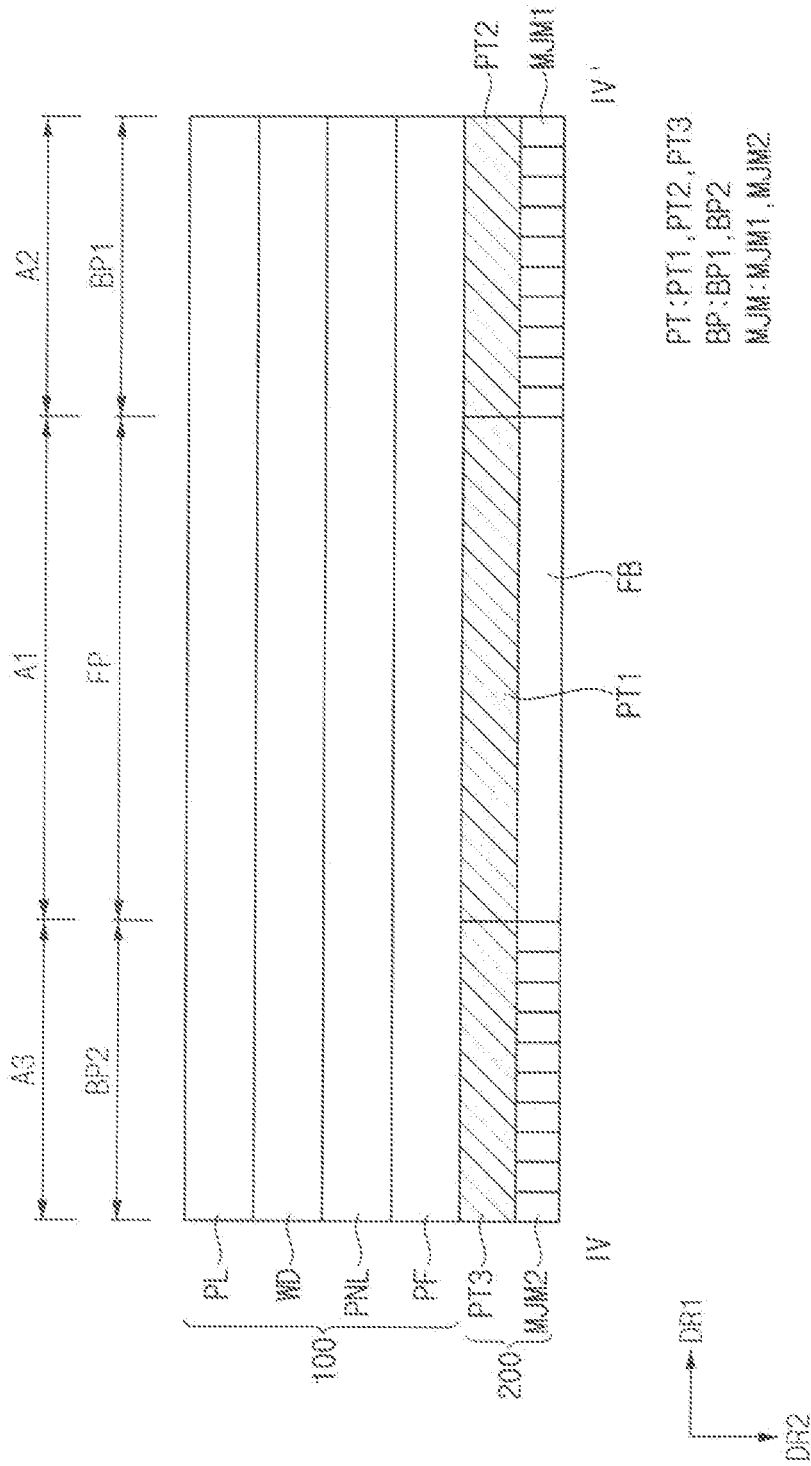

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0031015 under 35 U.S.C. § 119, filed on Mar. 11, 2022 in the Korean Intellectual Property Office (KIPO), the entire disclosure of which is incorporated herein by reference.

BACKGROUND

1. Technical Field

Embodiments relate to a display device. More specifically, embodiments relate to a flexible display device and method of manufacturing the same.

2. Description of the Related Art

Electronic devices provided in various forms may provide various functions or services. For example, the electronic device may provide an image display function through a display or an image capturing function through a camera.

Recently, in order to improve portability of an electronic device including a large-area display, an electronic device on which a flexible display is mounted has been proposed.

SUMMARY

Embodiments provide a display device with improved reliability.

Other embodiments provide a method of manufacturing the display device.

It should be noted that objects of the disclosure are not limited to the above-described objects, and other objects of the disclosure will be apparent to those skilled in the art from the following descriptions.

A display device according to an embodiment may include a plate including a first area and a second area adjacent to the first area and including pattern portions defining an opening pattern and segment portions disposed between the pattern portions, respectively, a display module including a flat portion disposed in the first area on the plate, and a bendable portion extending from the flat portion and disposed in the second area on the plate, segment members disposed in the second area under the plate and respectively overlapping the segment portions in a direction, first filling members disposed under the plate, disposed between the segment members, respectively overlapping the pattern portions in the direction, and having a first elastic modulus and second filling members respectively disposed under the first filling members, respectively overlapping the first filling members in the direction, and having a second elastic modulus different from the first elastic modulus.

In an embodiment, the first elastic modulus may be greater than the second elastic modulus.

In an embodiment, the first elastic modulus may be more than about 3 GPa, and the second elastic modulus may be less than about 1 GPa.

In an embodiment, the segment members may be spaced apart from each other by a distance.

In an embodiment, the segment members may respectively contact the segment portions, and the first filling members may respectively contact the pattern portions.

In an embodiment, a thickness of each of the first filling members in the direction may be less than a thickness of each of the second filling members in the direction.

In an embodiment, each of the segment members may include at least one protrusion protruding in another direction parallel to the plate, and the direction and the another direction intersect each other.

In an embodiment, the at least one protrusion may not overlap the first filling members in the another direction.

In an embodiment, a length from a lower surface of the at least one plate to the protrusion in the direction may be greater than the thickness of each of the first filling members in the direction.

In an embodiment, each of the first filling members and each of the second filling members may include different materials from each other.

In an embodiment, each of the first filling members may include at least one of polyurethane and thermoplastic polyurethane.

In an embodiment, each of the second filling members may include at least one of polyethylene and acryl.

A method of manufacturing a display device according to an embodiment may include forming a first filling layer having a first elastic modulus and a second filling layer having a second elastic modulus different from the first elastic modulus, laminating the first filling layer and the second filling layer, removing a portion of the first filling layer and the second filling layer and forming first filling members and second filling members respectively overlapping the first filling members in a direction, disposing segment members between the first filling members and between the second filling members, respectively, disposing a plate on the first filling members and the segment members, and disposing a display module on the plate.

In an embodiment, the first elastic modulus may be greater than the second elastic modulus.

In an embodiment, the plate may include a first plate, and a second plate extending from the first plate and including opening patterns spaced apart from each other by a distance.

In an embodiment, the disposing of the plate may include disposing the opening patterns of the second plate to respectively overlap the first filling members in the direction.

In an embodiment, the second plate may include pattern portions in which the opening patterns are formed, and segment portions respectively disposed between the pattern portions.

In an embodiment, the method may further include attaching the first filling members to the pattern portions, respectively, and attaching the segment members to the segment portions, respectively.

In an embodiment, a thickness of the first filling layer in the direction may be less than a thickness of the second filling layer in the direction.

In an embodiment, the first filling layer may be formed of at least one of polyurethane and thermoplastic polyurethane, and the second filling layer may be formed of at least one of polyethylene and acryl.

In a display device according to embodiments of the disclosure, as the display device includes a first filling member and a second filling member having different elastic moduli between adjacent segment members, in case that the display device slides, deformation of the display device may be prevented, and thus the reliability of the display device may be improved.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 22 is a schematic plan view of a display device according to an embodiment; and FIG. 23 is a schematic cross-sectional view taken along line IV-IV' of FIG. 22.

DETAILED DESCRIPTION OF THE EMBODIMENTS

Figure 1:
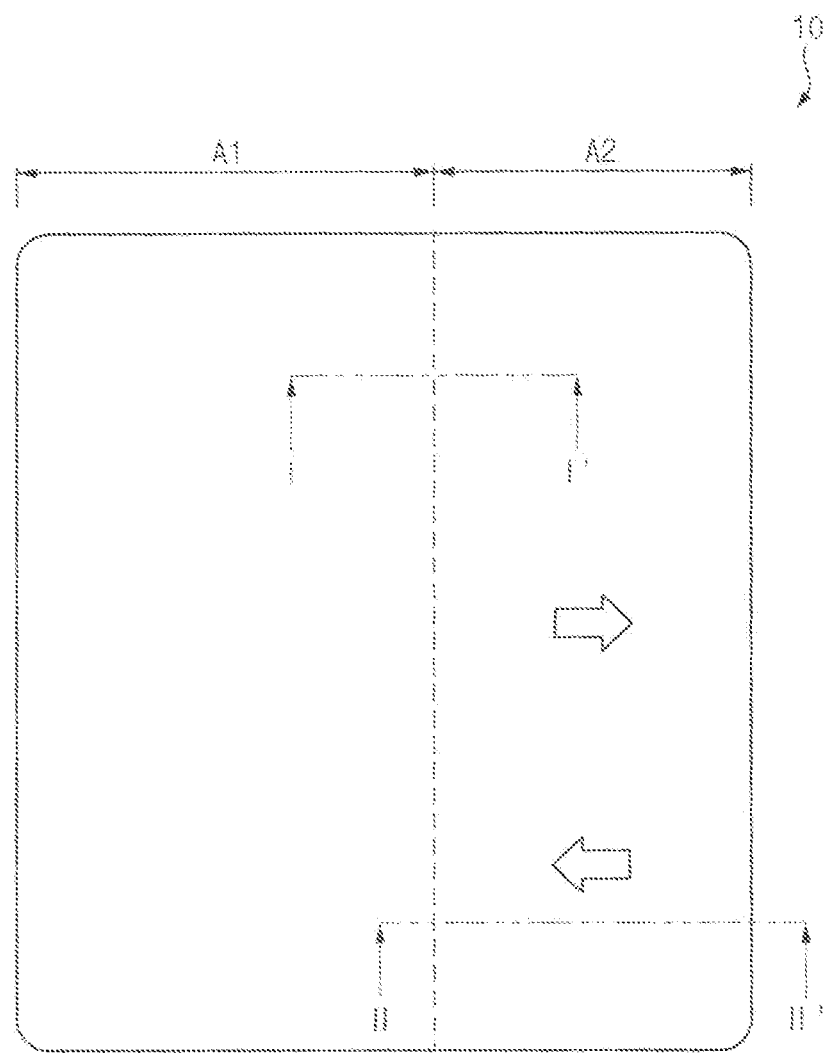
FIG. 1 is a schematic plan view of a display device according to an embodiment.

Hereinafter, display devices in accordance with embodiments will be described in more detail with reference to the accompanying drawings. The same reference numerals are used for the same components in the drawings, and redundant descriptions of the same components will be omitted.

Spatially relative terms, such as "beneath," "below," "under," "lower," "on," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic plan view of a display device according to an embodiment.

Referring to FIG. 1, a display device 10 may include a first area A1 and a second area A2. The first area A1 and the second area A2 may be display areas displaying an image. However, the disclosure is not limited thereto, and the first area A1 and the second area A2 may partially display an image.

In an embodiment, the display device 10 may be a slidable display device capable of adjusting a display area through sliding. The display area of the display device 10 may be expanded by being unfolded, and a display area may be reduced by being rolled up.

The first area A1 may be an area exposed to the outside and may have a flat shape. The second area A2 may be flexible, and may be an area exposed to the outside or accommodated inside as the display device 10 slides. The second area A2 may have a flat shape when exposed to the outside, and have a curved shape when accommodated inside.

For example, in case that the display device 10 is slid, an area of the second area A2 may change. In case that the display device 10 is unfolded by sliding, the area of the second area A2 may increase (see FIG. 4), and in case that the display device 10 is rolled up by sliding, the area of the second area A2 may be reduced (see FIG. 3).

Figure 2:
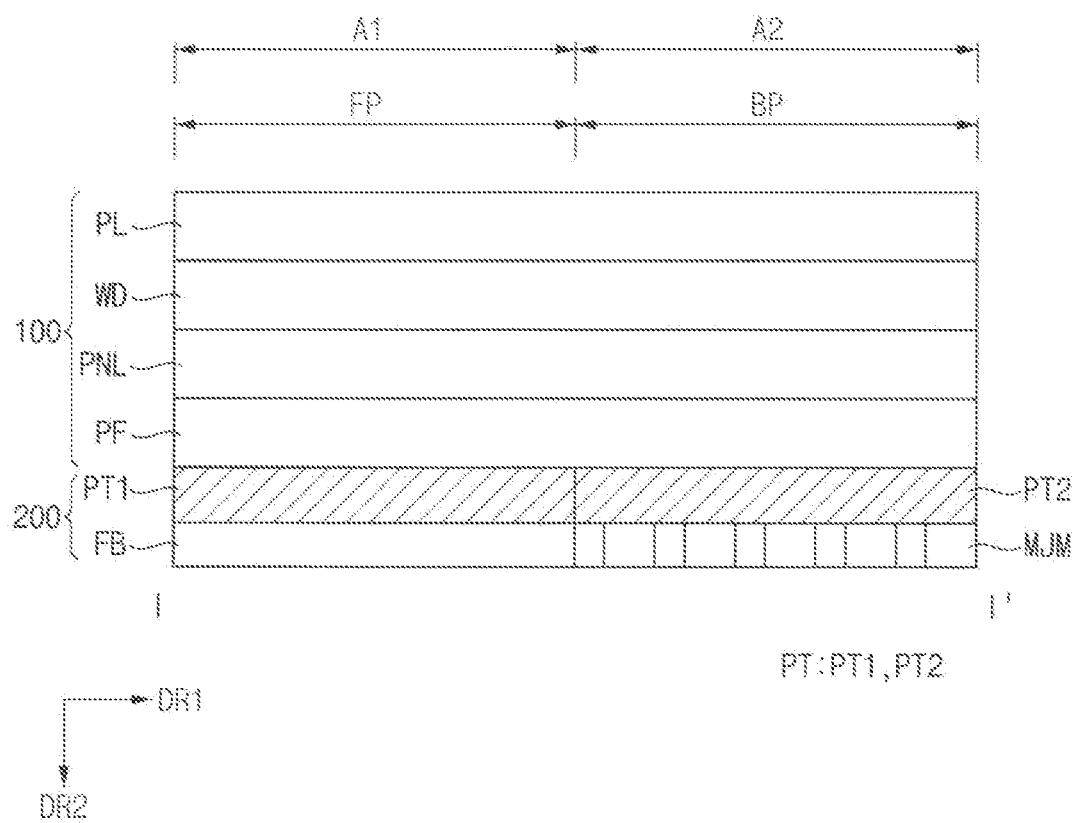
FIG. 2 is a schematic cross-sectional view taken along line I-I' of FIG. 1.

FIG. 2 is a schematic cross-sectional view taken along line I-I' of FIG. 1.

Referring to FIGS. 1 and 2, the display device 10 may include a display module 100 and a lower structure 200. The lower structure 200 may include a plate PT, a flat bar FB, and a multi-joint module MJM.

The display module 100 may include a flat portion FP and a bendable portion BP. The flat portion FP may be a portion overlapping (e.g., in a view or direction) the first area A1 in the display module 100. The flat portion FP may be an area exposed to the outside and may have a flat shape.

The bendable portion BP may be a portion overlapping the second area A2 of the display module 100. The bendable portion BP may be flexible. The bendable portion BP may extend from the flat portion FP in a first direction DR1. The first direction DR1 may be a direction from the first area A1 to the second area A2. The bendable portion BP may be a portion exposed to the outside or accommodated inside as the display device 10 slides.

The display module 100 may include a protective film PF, a display panel PNL, a window WD, and a protective layer PL.

The display panel PNL may display an image. The display panel PNL may include an organic light emitting display panel, an inorganic light emitting display panel, a quantum dot light emitting display panel, a micro LED display panel, a nano LED display panel, a plasma display panel, a field emission display panel, a cathode ray display panel, a liquid crystal display panel, and an electrophoretic display panel and the like.

The protective film PF may be disposed under the display panel PNL. The protective film PF may reduce stress applied to the display panel PNL in case that the display panel PNL is folded or bent. The protective film PF may prevent moisture and the like from penetrating into the display panel PNL, and may absorb an external shock.

The protective film PF may be a plastic film. For example, examples of the plastic film constituting the protective film PF may include polyimide (PI), polyethylene terephthalate (PET), polycarbonate (PC), polypropylene (PP), polyethersulfone (PES), polymethyl methacrylate (PMMA), triacetyl cellulose (TAC), cycloolefin polymer (COP), and the like.

The window WD may be disposed on the display panel PNL. The window WD may protect the display panel PNL. The window WD may include a transparent material. For example, the window WD may include glass, plastic, or the like.

In case that the window WD includes glass, the glass may be ultra-thin glass (UTG). In case that the glass is an ultra-thin glass, the glass may be flexible.

The protective layer PL may be disposed on the window WD. The protective layer PL may perform at least one of functions of preventing scattering of the window WD, absorbing shocks of the window WD, preventing engraving of the window WD, preventing fingerprints of the window WD and glare of the window WD. The protective layer PL may include a transparent polymer film. For example, examples of the transparent polymer film constituting the protective layer (PL) may include polyethylene terephthalate (PET), polyethylene naphthalate (PEN), polyethersulfone (PES), polyimide (PI), polyarylate (PAR), polycarbonate (PC), polymethyl methacrylate (PMMA), cycloolefin polymer (COP), and the like.

Embodiments according to the disclosure are not limited thereto, and the display panel PNL may further include a polarizing layer disposed on the display panel PNL and a buffer member disposed under the protective film PF. The polarization layer may polarize light passing through the polarization layer and may reduce reflection of external light of the display device 10. The buffer member may protect the display panel PNL by buffering an external shock which may be applied to the display panel PNL.

The plate PT may be disposed under the display module 100 in a second direction DR2. The second direction DR2 may be a direction intersecting the first direction DR1, and may be a direction from the display module 100 toward the lower structure 200. As the display device 10 includes the first area A1 and the second area A2, the plate PT may also include the first area A1 and the second area A2.

The plate PT may include a first plate PT1 and a second plate PT2.

The first plate PT1 may overlap the first area A1 and may overlap the flat portion FP of the display module 100. For example, the flat portion FP may be disposed on the first plate PT1.

The second plate PT2 may extend from the first plate PT1 in the first direction DR1. The first direction DR1 may be a direction parallel to the first plate PT1. The second plate PT2 may overlap the second area A2 and may overlap the bendable portion BP of the display module 100. For example, the bendable portion BP may be disposed on the second plate PT2.

The second plate PT2 may be flexible. The second plate PT2 may be exposed to the outside or accommodated inside as the display device 10 slides.

The flat bar FB may be disposed under the first plate PT1. The flat bar FB may overlap the first area A1 and the flat portion FP of the display module 100. The flat bar FB may have a hollow flat rectangular parallelepiped shape. However, the shape of the flat bar FB according to the embodiments of the disclosure is not limited thereto.

The flat bar FB and the multi joint module MJM may have a same thickness. However, embodiments of the disclosure are not limited thereto.

The multi joint module MJM may be disposed under the second plate PT2. The multi joint module MJM may overlap the second area A2 and the bendable portion BP of the display module 100. The multi joint module MJM may guide the movement of the bendable portion BP. The multi joint module MJM may move the bendable portion BP of the display module 100 while maintaining a smooth shape (e.g., which is not deformed to have a convex part or concave part).

The protective layer PL, the window WD, the display panel PNL, the protective film PF, the plate PT, the flat bar FB, and the multi joint module MJM may be attached to each other with adhesive layers therebetween. However, embodiments according to the disclosure may not be limited thereto, and the adhesive layers may be omitted in some embodiments.

Figure 3:
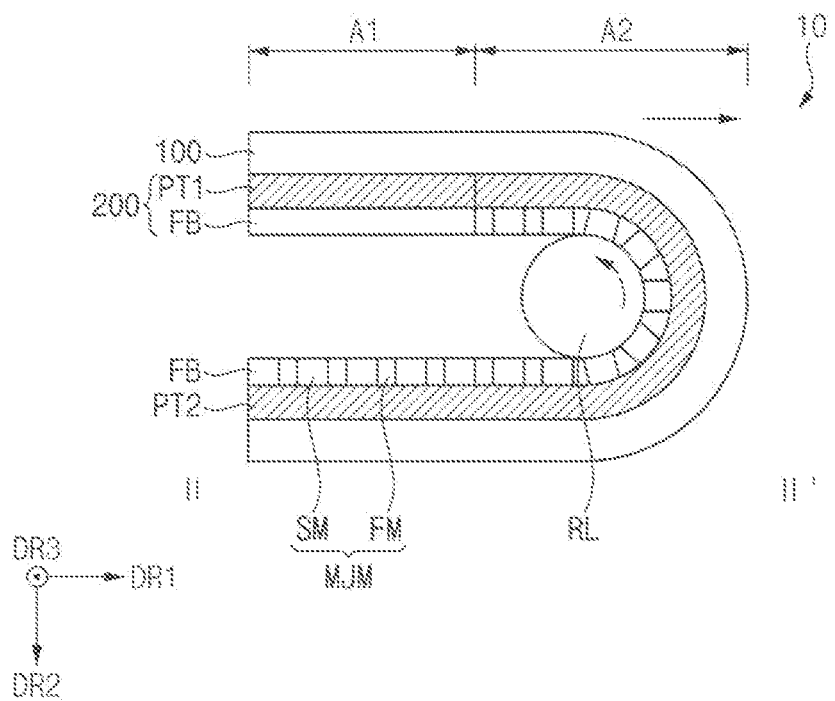
FIG. 3 is a schematic cross-sectional view taken along line II-II' of FIG. 1.
Figure 4:
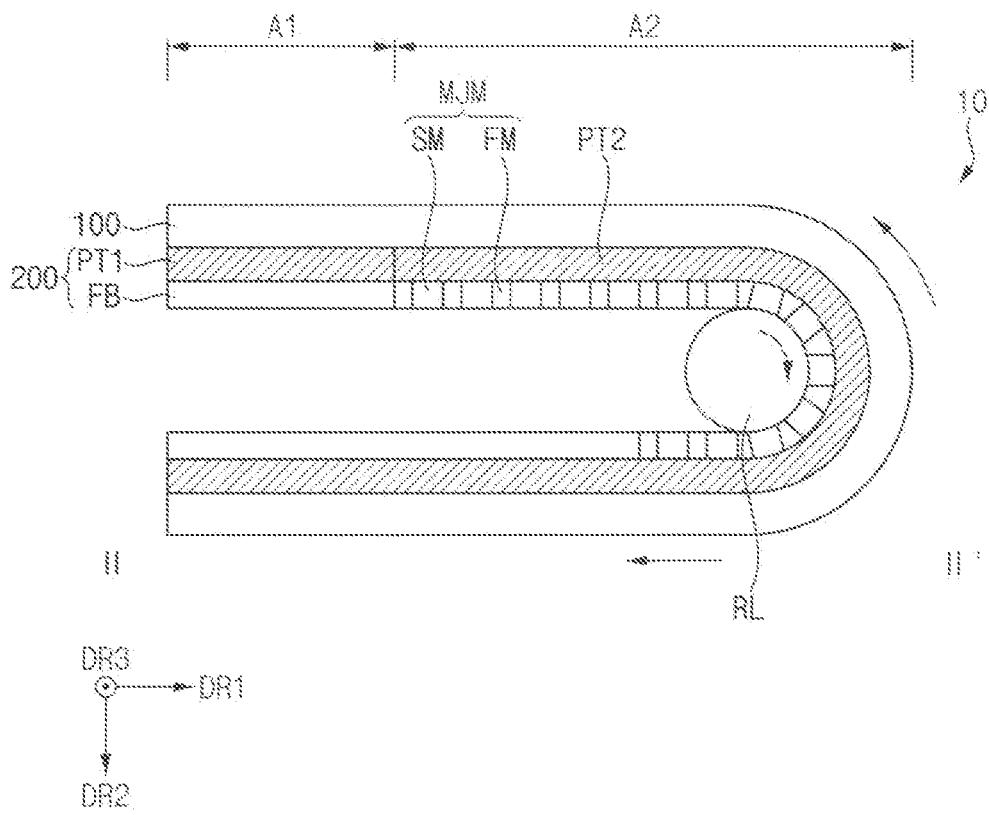
FIG. 4 is a schematic cross-sectional view illustrating the display device of FIG. 3 in an unfolded state.

FIGS. 3 and 4 are schematic views illustrating a sliding method of the display device of FIG. 1. For example, FIG. 3 is a schematic cross-sectional view taken along line II-II' of FIG. 1. FIG. 4 is a schematic cross-sectional view illustrating the display device of FIG. 3 in an unfolded state.

Referring to FIGS. 1 to 4, the display device 10 may further include a roller RL.

The roller RL may be located at an end of the display device 10. The roller RL may rotate in a clockwise or counterclockwise direction, and may wind or unfold the display device 10. The upper surface of the display device 10 in the second area A2 may maintain a curved shape by the roller RL.

In case that the roller RL rotates counterclockwise, the display device 10 may slide in an unfolding direction (e.g., the first direction DR1) (see FIG. 3). In case that the display device 10 slides in the unfolding direction, the second area A2 may be unfolded from the roller RL. As the second area A2 is extended from the roller RL, the display area of the display device 10 visually recognized to the outside may be expanded (see FIG. 4).

In case that the roller RL rotates clockwise, the display device 10 may slide in a winding direction (e.g., a direction opposite to the first direction DR1) (see FIG. 4). In case that the display device 10 slides in the winding direction, the second area A2 may be wound inside from the roller RL. As the second area A2 is wound from the roller RL, the display area of the display device 10 visually recognized to the outside may be reduced (see FIG. 3). Accordingly, the display area of the display device 10 may be secured according to the sliding state of the display device 10, and portability of the display device 10 may be improved.

Figure 5:
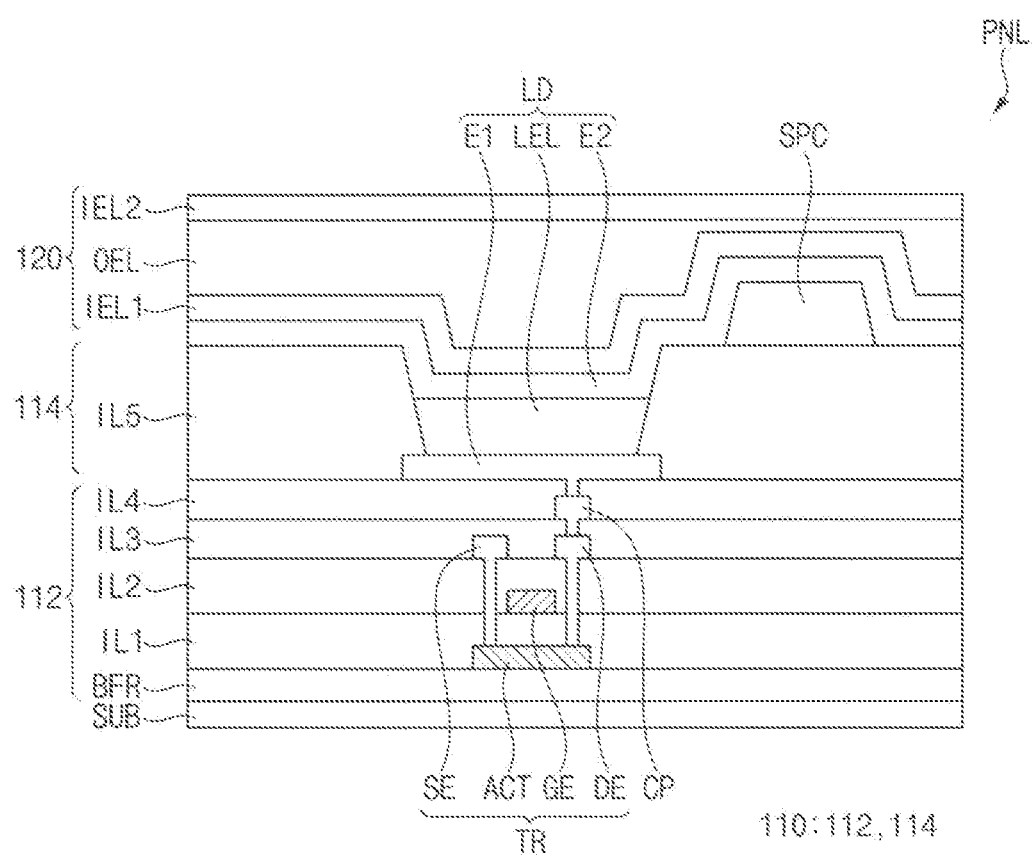
FIG. 5 is a schematic cross-sectional view illustrating the display panel of FIG. 2.

FIG. 5 is a schematic cross-sectional view illustrating the display panel of FIG. 2.

Referring to FIG. 5, the display panel PNL may include a substrate SUB, a display element layer 110, and an encapsulation layer 120. The display element layer 110 may include a circuit element layer 112 and a light emitting element layer 114.

The circuit element layer 112 may be disposed on the substrate SUB, and may include a buffer layer BFR, at least one transistor TR, a connection electrode CP, a first insulation layer IL1, and a second insulation layer IL2, a third insulation layer IL3, and a fourth insulation layer IL4. The transistor TR may include an active layer ACT, a gate electrode GE, a source electrode SE, and a drain electrode DE. The light emitting element layer 114 may be disposed on the circuit element layer 112, and may include a fifth insulation layer IL5, a spacer SPC, and a light emitting diode LD. The light emitting diode LD may include a first electrode E1, a light emitting layer LEL, and a second electrode E2.

The buffer layer BFR may be disposed on the substrate SUB. The buffer layer BFR may prevent diffusion of metal atoms or impurities from the substrate SUB to the active layer ACT.

The active layer ACT may be disposed on the substrate SUB. The active layer ACT may be divided into a source region and a drain region doped with impurities, and a channel region between the source region and the drain region.

The first insulation layer IL1 may be disposed on the buffer layer BFR. The first insulation layer IL1 may cover (or overlap) the active layer ACT and may be formed to have substantially a same thickness along a profile of the active layer ACT. However, the disclosure is not limited thereto. For example, the first insulation layer IL1 may include an inorganic material.

The gate electrode GE may be disposed on the first insulation layer IL1, In an embodiment, the gate electrode GE may overlap the channel region of the active layer ACT.

The second insulation layer IL2 may be disposed on the first insulation layer ILL Also, the second insulation layer IL2 may cover the gate electrode GE and may be disposed to have substantially a same thickness along a profile of the gate electrode GE. However, the disclosure is not limited thereto.

The source electrode SE and the drain electrode DE may be disposed on the second insulation layer IL2. The source electrode SE may contact the source region of the active layer ACT through a first contact hole formed in the first and second insulation layers IL1 and IL2. The drain electrode DE may contact the drain region of the active layer ACT through a second contact hole formed in the first and second insulation layers IL1 and IL2.

The third insulation layer IL3 may be disposed on the second insulation layer IL2. The third insulation layer IL3 may cover the source and drain electrodes SE and DE, and may have a substantially flat top surface without creating a step around the source and drain electrodes SE and DE. For example, the third insulation layer IL3 may include an organic material.

The connection electrode CP may be disposed on the third insulation layer IL3. The connection electrode CP may contact the source electrode SE or the drain electrode DE through a third contact hole formed in the third insulation layer IL3.

The fourth insulation layer IL4 may be disposed on the third insulation layer IL3. Also, the fourth insulation layer IL4 may cover the connection electrode CP, and may have a substantially flat top surface without generating a step (e.g., height difference or thickness difference) around the source and drain electrodes SE and DE. For example, the fourth insulation layer IL4 may include an organic material.

The first electrode E1 may be disposed on the fourth insulation layer IL4. The first electrode E1 may have reflective or transmissive properties. For example, the first electrode E1 may include a metal.

The first electrode E1 may contact the connection electrode CP through a fourth contact hole formed in the fourth insulation layer IL4. Through this, the first electrode E1 may be connected to the transistor TR.

The fifth insulation layer IL5 may be disposed on the fourth insulation layer IL4, and may define an opening exposing the upper surface of the first electrode E1. For example, the fifth insulation layer IL5 may include an organic material or an inorganic material.

The spacer SPC may be disposed on the fifth insulation layer IL5. For example, the spacer SPC may include an organic material or an inorganic material. The spacer SPC may maintain a gap between the encapsulation layer 120 and the substrate SUB.

The spacer SPC and the fifth insulation layer IL5 may include different materials. The spacer SPC may be formed after the fifth insulation layer IL5 is formed. However, embodiments according to the disclosure are not limited thereto, and the spacer SPC and the fifth insulation layer IL5 may include a same material.

The light emitting layer LEL may be disposed on the first electrode E1. The light emitting layer LEL may be disposed in the opening formed in the fifth insulation layer IL5. In an embodiment, the light emitting layer LEL may have a multilayer structure including a hole injection layer, a hole transport layer, an organic emission layer, an electron transport layer, and an electron injection layer. The organic emission layer may include a light emitting material.

The second electrode E2 may cover the light emitting layer LEL and may be disposed on the fifth insulation layer IL5 and the spacer SPC. In an embodiment, the second electrode E2 may have a plate shape. The second electrode E2 may have transmissive or reflective properties. For example, the second electrode E2 may include a metal.

The encapsulation layer 120 may prevent moisture and oxygen from penetrating into the light emitting diode LD from the outside. For example, the encapsulation layer 120 may include a first inorganic encapsulation layer IEL1, an organic encapsulation layer OEL, and a second inorganic encapsulation layer IEL2.

The first inorganic encapsulation layer IEL1 may be disposed on the second electrode E2 to have substantially a same thickness along a profile of the second electrode E2. The organic encapsulation layer OEL may be disposed on the first inorganic encapsulation layer IEL1, and may have a substantially flat top surface without creating a step around the first inorganic encapsulation layer IEL1. The second inorganic encapsulation layer IEL2 may be disposed on the organic encapsulation layer OEL.

Figure 6:
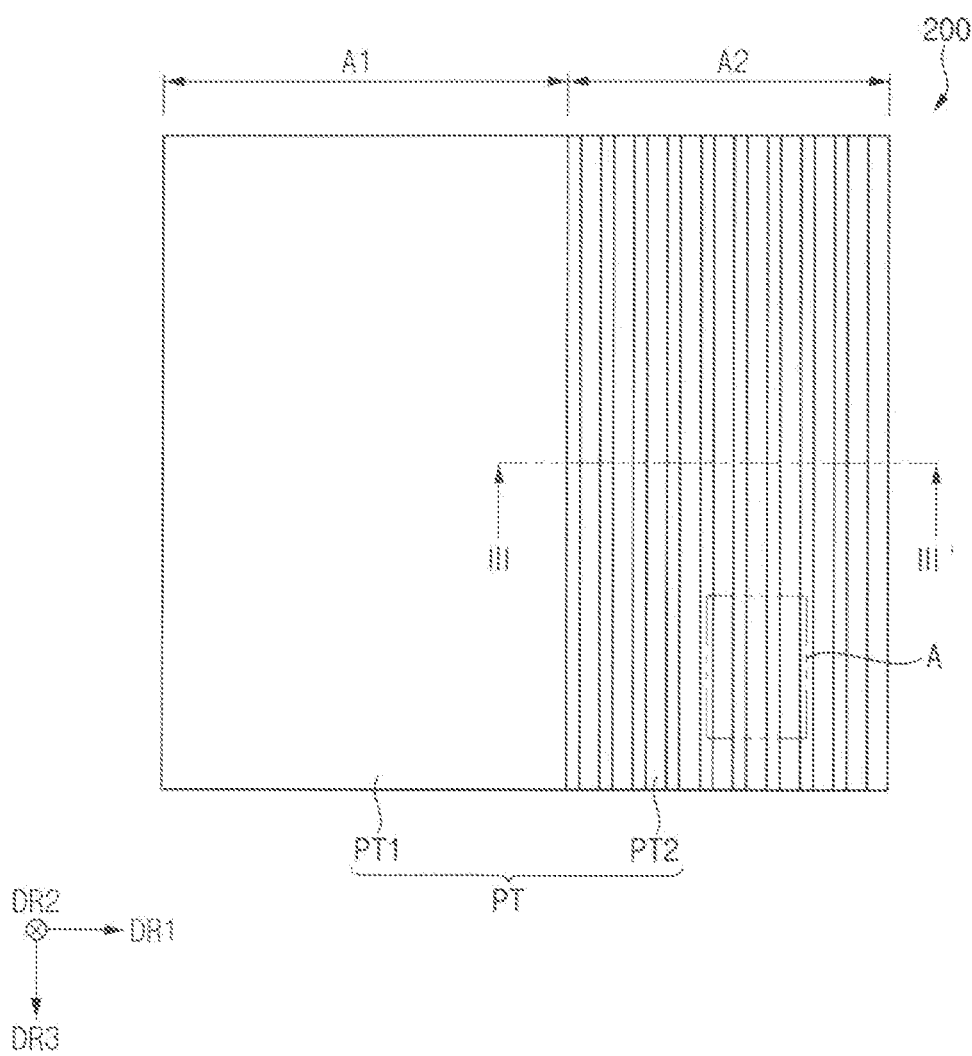
FIG. 6 is a schematic plan view illustrating a lower structure of the display device of FIG. 1.
Figure 7:
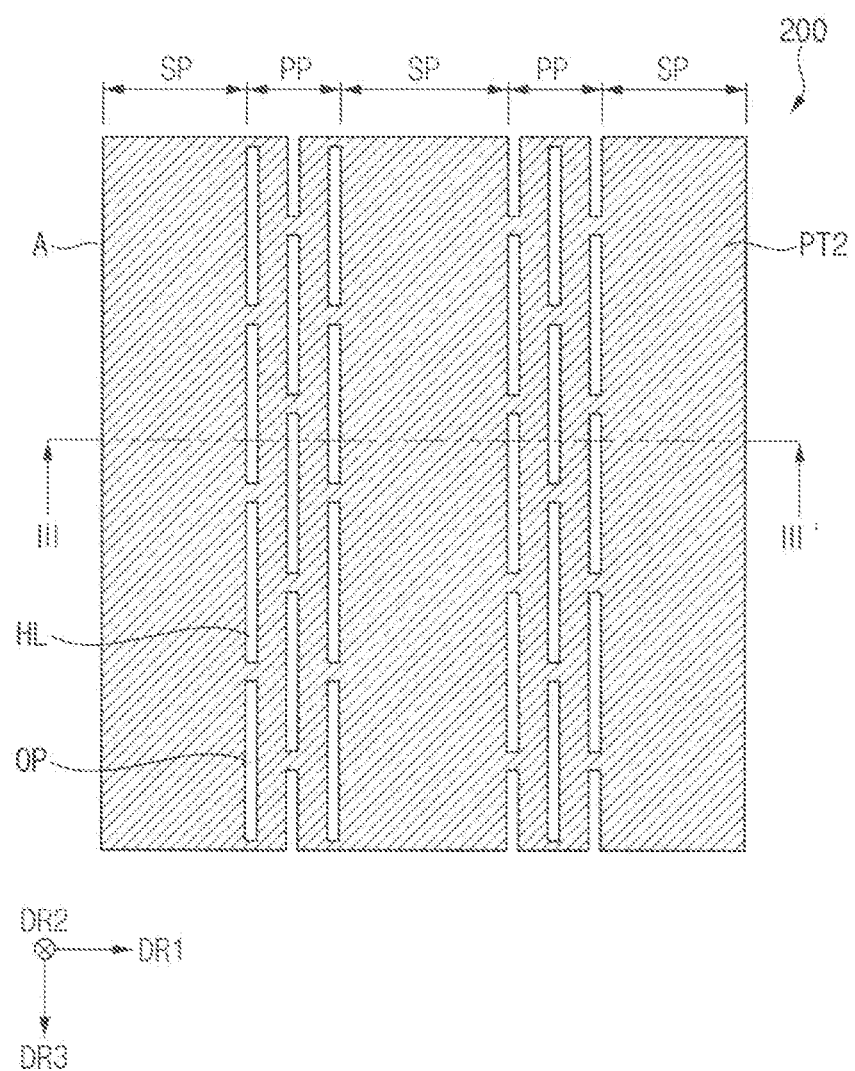
FIG. 7 is a schematic enlarged plan view of area A of FIG. 6.
Figure 8:
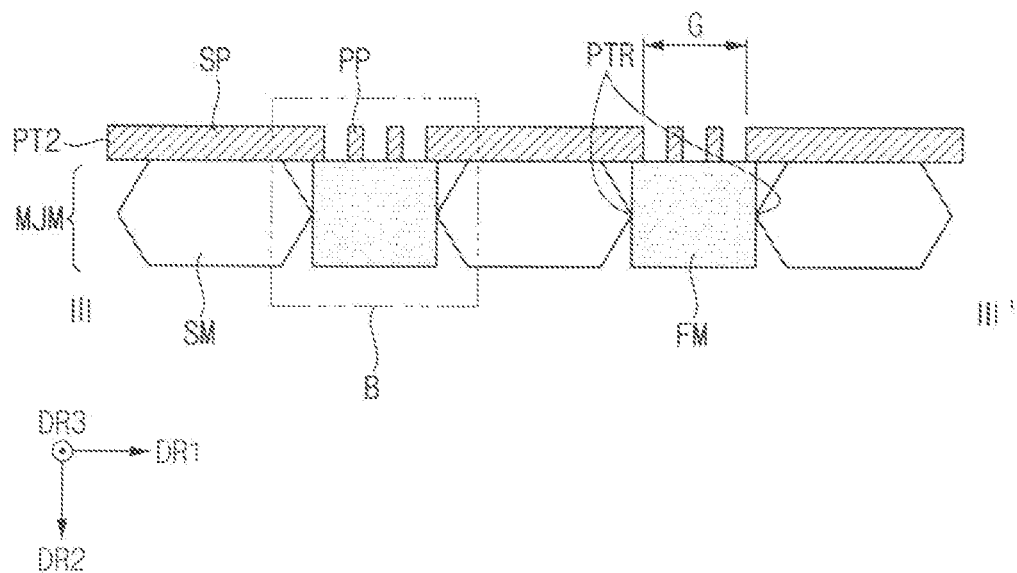
FIG. 8 is a schematic cross-sectional view taken along line of FIG. 7.

FIG. 6 is a schematic plan view illustrating a lower structure of the display device of FIG. 1. FIG. 7 is a schematic enlarged plan view of area A of FIG. 6. FIG. 8 is a schematic cross-sectional view taken along line III-III' of FIG. 7.

Referring to FIGS. 6 to 8, the second plate PT2 may include pattern portions PP and segment portions SP. The pattern portions PP and the segment portions SP may be alternately disposed in the first direction DR1. For example, the segment portions SP may be respectively disposed between the adjacent pattern portions PP. The adjacent pattern portions PP and the segment portions SP may be connected to each other.

The segment portions SP may extend in a third direction DR3. The third direction DR3 may be a direction intersecting the first direction DR1 and the second direction DR2. The segment portions SP may extend in the third direction DR3 and may be disposed to be spaced apart from each other in the first direction DR1.

An opening pattern OP may be defined in each of the pattern portions PP. The opening pattern OP may include openings HL. Each of the openings HL may have one of a rectangular shape, a rhombus shape, an elliptical shape, a wavy shape, and a rounded rectangle shape. However, the embodiments are not limited thereto.

Each of the openings HL may have a same shape. In detail, each of the openings HL may have a same rectangular shape. Each of the openings HL may have a shape extending in the third direction DR3. For example, a long axis of each of the openings HL may be parallel to the third direction DR3. The rectangular shapes may have a specific length and may be spaced apart from each other on a same line by a distance (e.g., a predetermined or selectable distance). However, embodiments according to the disclosure are not limited thereto.

The multi joint module MJM may include segment members SM and filling members FM. The segment members SM may be disposed under the second plate PT2. The segment members SM may overlap the segment portions SP, respectively, and may respectively contact bottom surfaces of the segment portions SP. The segment members SM may be disposed to be spaced apart from each other at a distance G (e.g., a predetermined or selectable distance). The distance G may be substantially equal to a width of each of the pattern portions PP in the first direction DR1.

The segment members SM may extend in the third direction DR3. The segment members SM may extend in the third direction DR3 and may be disposed to be spaced apart from each other in the first direction DR1. A shape of each of the segment members SM and a shape of each of the segment portions SP may be substantially the same in a plan view.

Each of the segment members SM may include at least one protrusion PTR protruding in the first direction DR1. For example, a cross-section of each of the segment members SM may have a hexagonal shape, and each of the segment members SM may include protrusions PTR protruding in the first direction DR1 and in a direction opposite to the first direction DR1. However, embodiments according to the disclosure are not limited thereto.

The filling members FM may be disposed under the second plate PT2. The filling members FM may be respectively disposed between the segment members SM. The filling members FM may overlap the pattern portions PP, respectively, and may contact bottom surfaces of the pattern portions PP, respectively. The filling members FM may be disposed to be spaced apart from each other at distances (e.g., predetermined or selectable distances). The distance may be substantially equal to a width of each of the segment portions SP in the first direction DR1.

Figure 9:
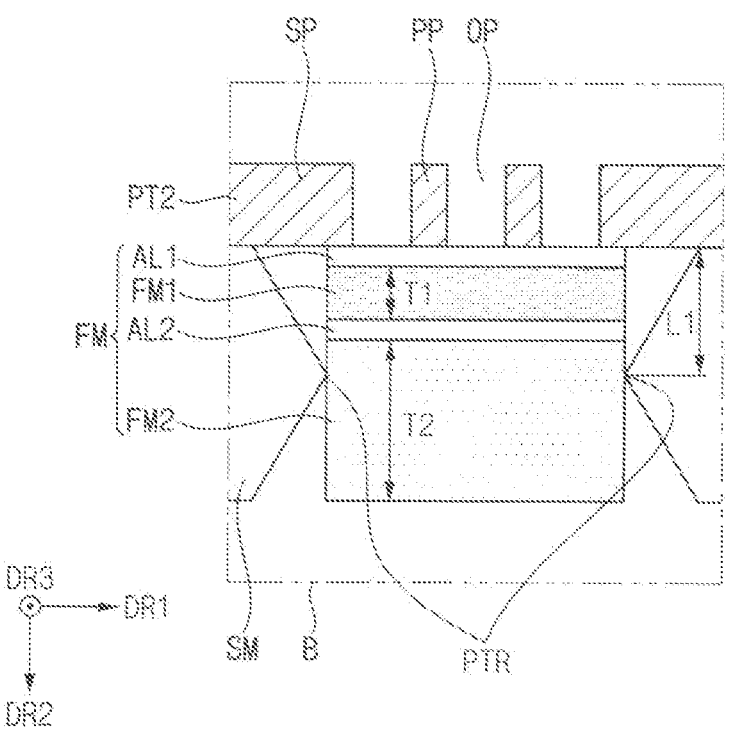
FIG. 9 is a schematic enlarged cross-sectional view of area B of FIG. 8.
Figure 10:
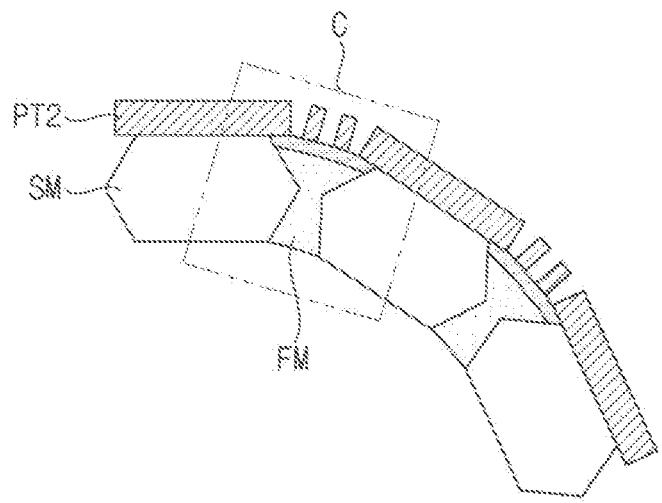
FIG. 10 is a schematic cross-sectional view illustrating a state in which a lower structure of the display device of FIG. 8 is curved.
Figure 11:
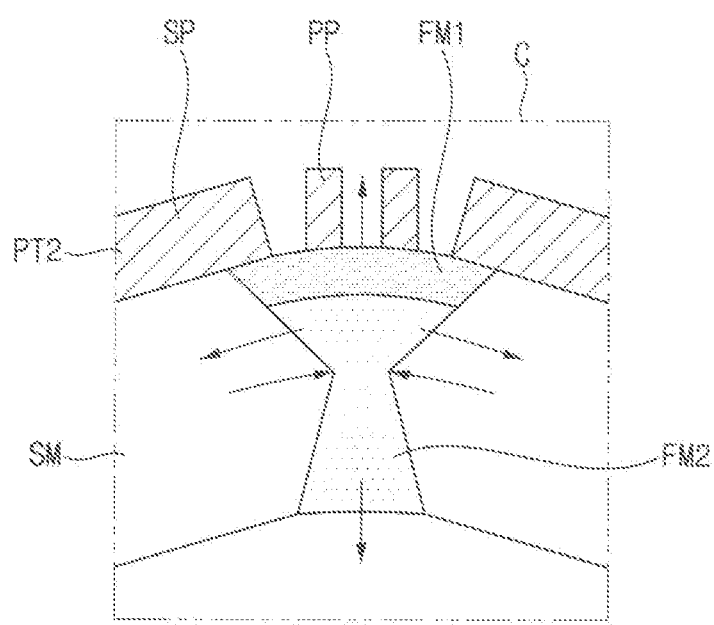
FIG. 11 is a schematic enlarged cross-sectional view of area C of FIG. 10.

FIG. 9 is a schematic enlarged cross-sectional view of area B of FIG. 8. FIG. 10 is a schematic cross-sectional view illustrating a state in which a lower structure of the display device of FIG. 8 is curved. FIG. 11 is a schematic enlarged cross-sectional view of area C of FIG. 10.

Referring further to FIG. 9, in an embodiment, each of the filling members FM may include at least one first filling member FM1 and at least one second filling member FM2. For example, a filling member FM may include a first filling member FM1 and a second filling member FM2.

The first filling members FM1 respectively included in the filling members FM may be disposed under the second plate PT2 and may contact a bottom surface of the second plate PT2. For example, the first filling members FM1 may contact the bottom surfaces of the pattern portions PP, respectively.

The second filling members FM2 respectively included in the filling members FM may overlap the first filling members FM1, respectively, and may be respectively disposed under the first filling members FM1.

In an embodiment, the first filling members FM1 may have a first elastic modulus. The second filling members FM2 may have a second elastic modulus. The second elastic modulus may be different from the first elastic modulus.

In an embodiment, the first elastic modulus may be greater than the second elastic modulus. The first filling members FM1 may have a relatively larger elastic modulus than the second filling members FM2. For example, the first filling members FM1 may have relatively greater rigidity than the second filling members FM2. Accordingly, the first filling members FM1 may prevent the display device 10 from being deformed and support the second plate PT2. Accordingly, an impact resistance of the display device 10 may be improved with respect to the pressure applied on the display module 100, and thus sagging deformation of the display device 10 may be reduced.

The second filling members FM2 may be deformed due to the segment members SM in case that the second area A2 is bent due to the sliding of the display device 10 (see FIGS. 10 and 11). Also, in case that the second area A2 becomes flat again (see FIGS. 8 and 9), the second filling members FM2 may be restored to its original shape in order that the segment members SM maintain the distance G (e.g., a predetermined or selectable distance). Accordingly, even in case that the display device 10 is repeatedly slid, the display device 10 may maintain its original shape.

In case that the first filling members FM1 have relatively greater rigidity than the second filling members FM2, the first filling members FM1 may maintain the distance G (e.g., a predetermined or selectable distance) between the segment members SM which are spaced apart from each other in case that the display device 10 is repeatedly slid. The second filling members FM2 may prevent deformation of the lower structure 200 by accommodating the pressure by the segment members SM.

In an embodiment, the first elastic modulus may be more than or equal to about 3 GPa, and the second elastic modulus may be less than or equal to about 1 GPa. In case that the first elastic modulus is less than about 3 GPa, the first filling members FM1 may not effectively support the second plate PT2, and thus the display device 10 may be deformed. Also, in case that the second elastic modulus is greater than about 1 GPa, the second filling members FM2 are not easily deformed, so that the shape of the segment members SM may be deformed. In case that the display device 10 is repeatedly slid, the display device 10 may be deformed.

In an embodiment, a thickness T1 of each of the first filling members FM1 may be smaller than a thickness T2 of each of the second filling members FM2. The protrusions PTR may not overlap the first filling members FM1 in the first direction DR1. The protrusions PTR may not contact the first filling members FM1. A length L1 from the bottom surface of the second plate PT2 to the protrusion PTR in the second direction DR2 may be greater than the thickness T1 of each of the first filling members FM1.

Since the protrusions PTR do not overlap the first filling members FM1 in the first direction DR1, the protrusions PTR may overlap and contact the second filling members FM2. Accordingly, as the protrusions PTR contact the second filling members FM2 having a relatively small elastic modulus, in case that the display device 10 slides, deformation of the protrusions PTR may be prevented.

In an embodiment, each of the first filling members FM1 and each of the second filling members FM2 may include different materials. Each of the first filling members FM1 may include at least one of polyurethane and thermoplastic polyurethane. Each of the second filling members FM2 may include at least one of polyethylene and acrylic.

A first adhesive layer AL1 may be disposed between the first filling member FM1 and the second plate PT2, and a second adhesive layer AL2 may be disposed between the first filling member FM1 and the second filling member FM2. The first filling member FM1 may be attached to the second plate PT2 through the first adhesive layer AL1, and the second filling member FM2 may be attached to the first filling member FM1 through the second adhesive layer AL2. However, embodiments according to the disclosure are not limited thereto, and the first adhesive layer AL1 and the second adhesive layer AL2 may be omitted.

Referring further to FIGS. 10 and 11, in case that the display device 10 is slid, the shape of a portion of the lower structure 200 positioned at the curved portion of the second area A2 may be deformed. For example, the pattern portions PP included in the second plate PT2 may be folded. As the pattern portions PP of the second plate PT2 are folded, the second plate PT2 may maintain a curved shape by the roller RL.

The segment portions SP included in the second plate PT2 may relatively maintain an original shape compared to the pattern portions PP. The segment members SM overlapping the segment portions SP may also maintain an original shape.

In an embodiment, the filling members FM disposed between the segment members SM may be deformed. Among the filling members FM, the second filling members FM2 contacting the protrusions PTR may receive a relatively large pressure by the protrusions PTR. Specifically, a portion of the second filling members FM2 spaced apart from the second plate PT2 based on a portion overlapping the protrusions PTR may receive pressure by the protrusions PTR and may be compressed. On the other hand, a portion of the second filling members FM2 adjacent to the second plate PT2 with respect to the protrusions PTR may be stretched due to the folding of the second plate PT2. Also, since the first filling members FM1 are adjacent to the second plate PT2, they may be stretched due to the folding of the second plate PT2.

Since the first filling members FM1 have relatively greater rigidity than the second filling members FM2, the first filling members FM1 may restore the lower structure 200 to its original shape in case that the second area A2 is changed from a curved state to an unfolded state by using elastic force. Also, the first filling members FM1 may maintain the distance G between the segment members SM.

The second filling members FM2 may receive pressure from the segment members SM in case that the second area A2 is changed from an unfolded state to a curved state. In case that the second area A2 is changed to an unfolded state, the second filling members FM2 may be restored to their original shape because the pressure by the segment members SM is eliminated.

Figure 12:
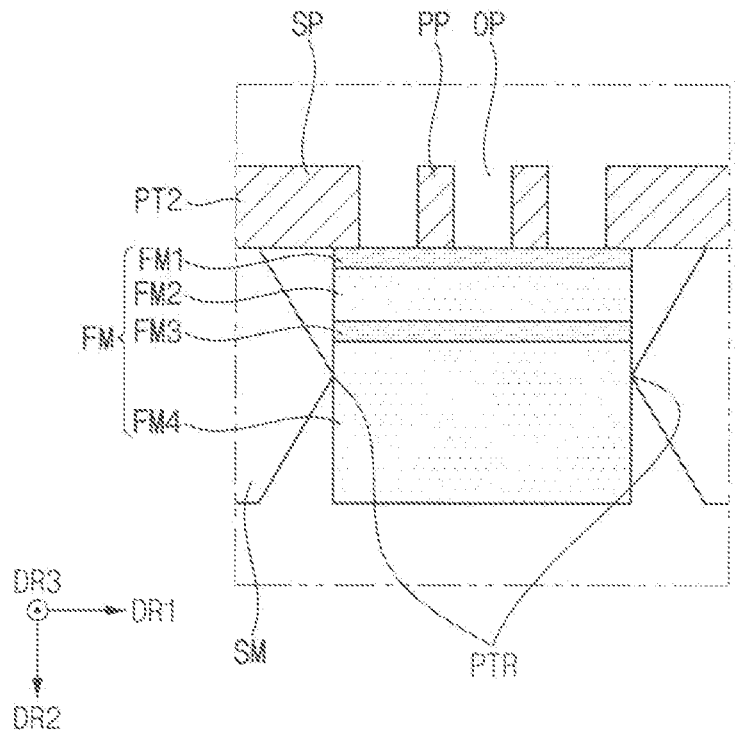
FIG. 12 is a schematic cross-sectional view illustrating another example of FIG. 9.

FIG. 12 is a schematic cross-sectional view illustrating another example of FIG. 9.

Among the filling members FM described with reference to FIG. 12, the substantially same parts as those of the filling members FM described with reference to FIG. 9 may be omitted below.

Referring to FIG. 12, each of the filling members FM may include at least one first filling member FM1 and at least one second filling member FM2. For example, a filling member FM may include a first filling member FM1, a second filling member FM2, a third filling member FM3, and a fourth filling member FM4.

The first filling member FM1 may be disposed under the second plate PT2, and the second filling member FM2 may overlap the first filling member FM1 and may be disposed under the first filling member FM1. The third filling member FM3 may overlap the second filling member FM2 and may be disposed under the second filling member FM2, and the fourth filling member FM4 may overlap the third filling member FM3 and may be disposed under the third filling member FM3.

Each of the first filling member FM1 and the third filling member FM3 may have a greater elastic modulus than each of the second filling member FM2 and the fourth filling member FM4. For example, the first filling member FM1 and the third filling member FM3 may have relatively greater rigidity than the second filling member FM2 and the fourth filling member FM4.

The protrusions PTR may not overlap the first filling member FM1 and the third filling member FM3 in the first direction DR1. The protrusions PTR may overlap and contact the fourth filling member FM4. The third filling member FM3 may be disposed closer to the second plate PT2 than the protrusions PTR.

Each of the first filling member FM1 and the third filling member FM3 may include at least one of polyurethane and thermoplastic polyurethane. Each of the second filling member FM2 and the fourth filling member FM4 may include at least one of polyethylene and acryl.

The first filling member FM1 and the third filling member FM3 may include a same material. The second filling member FM2 and the fourth filling member FM4 may include a same material. However, the disclosure is not limited thereto, and the first filling member FM1 and the third filling member FM3 may include different materials, and the second filling member FM2 and the fourth filling member FM4 may include different materials.

FIGS. 13 to 21 are schematic cross-sectional views illustrating a method of manufacturing a display device according to an embodiment.

For example, a method of manufacturing a display device described with reference to FIGS. 13 to 21 may be a method of manufacturing the display device 10 according to FIGS. 1 to 11.

Accordingly, the method of manufacturing the display device described with reference to FIGS. 13 to 21, the substantially same parts as those of the display device 10 described with reference to FIGS. 1 to 11 may be omitted below.

Figure 13:
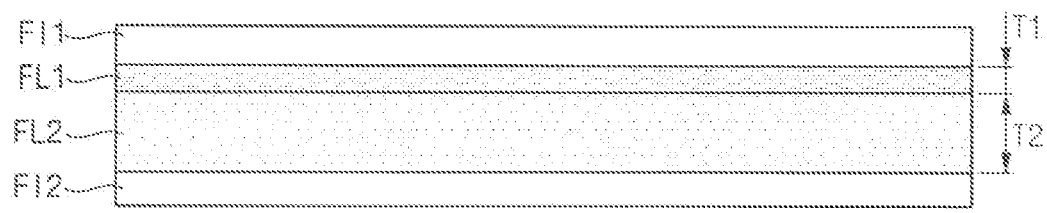
FIGS. 13 to 21 are schematic cross-sectional views illustrating a method of manufacturing a display device according to an embodiment.
Figure 13:
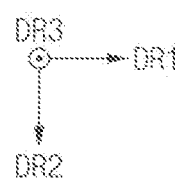

Referring to FIG. 13, a first filling layer FL1 and a second filling layer FL2 may be prepared. The first filling layer FL1 may be formed on the second filling layer FL2. The second filling layer FL2 may have a second elastic modulus, and the first filling layer FL1 may have a first elastic modulus greater than the second elastic modulus.

The first filling layer FL1 and the second filling layer FL2 may be formed of different materials. The first filling layer FL1 may be formed of at least one of polyurethane and thermoplastic polyurethane. The second filling layer FL2 may be formed of at least one of polyethylene and acrylic.

A thickness T1 of the first filling layer FL1 may be smaller than a thickness T2 of the second filling layer FL2.

The first filling layer FL1 and the second filling layer FL2 may be disposed between a first film FI1 and a second film FI2. The first filling layer FL1 and the second filling layer FL2 may be laminated using the first film FI1 and the second film FI2.

Figure 14:
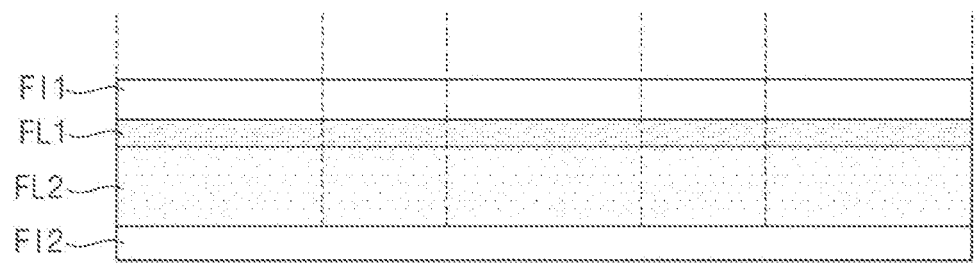
Figure 15:
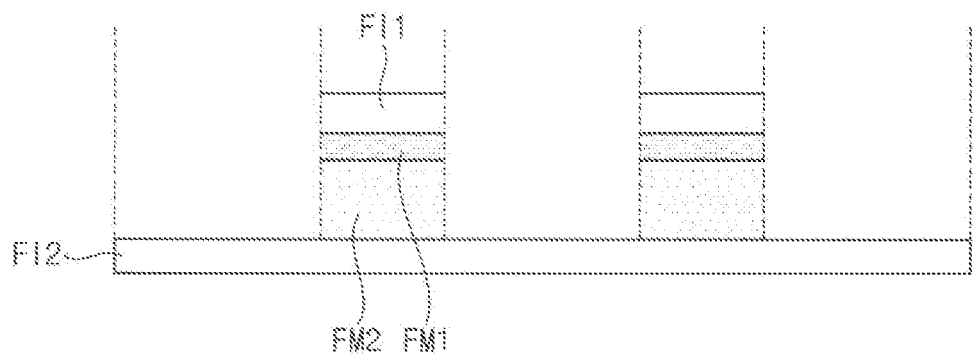

Referring to FIGS. 14 and 15, portions of each of the first filling layer FL1 and the second filling layer FL2 may be removed. The removed portions may be positioned at distances (e.g., predetermined or selectable distances) from each other. Portions of each of the second filling layer FL2, the first filling layer FL1, and the first film FI1 on the second film FI2 may be cut by a laser or a knife. Thereafter, the portions of each of the second filling layer FL2, the first filling layer FL1, and the first film FI1 may be removed.

As the portions of the first filling layer FL1 are removed, first filling members FM1 may be formed, and as the portions of the second filling layer FL2 are removed, the second filling members FM2 may be formed. Accordingly, the first filling members FM1 and the second filling members FM2 may overlap each other.

Figure 16:
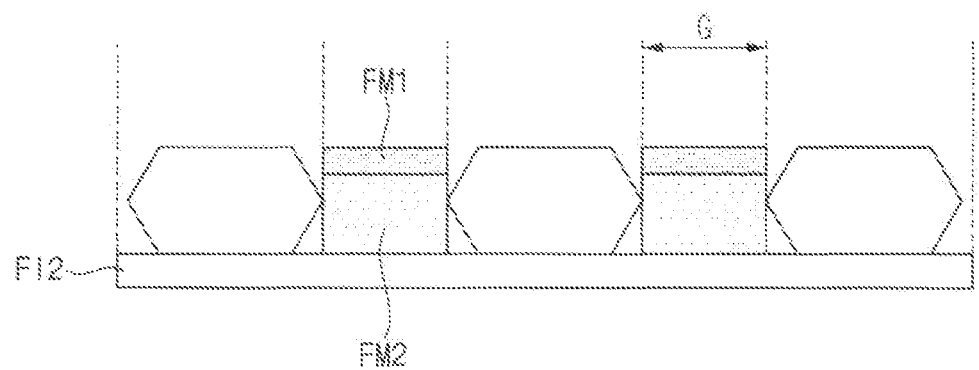

Referring to FIG. 16, after the first filling members FM1 and the second filling members FM2 are formed, the first filling members FM1 and the second filling members FM2 may be disposed adjacent to each other. Each of segment members SM may be disposed therebetween. The segment members SM may extend in the third direction DR3 and may be disposed to be spaced apart from each other by a distance G (e.g., a predetermined or selectable distance) in the first direction DR1. Also, the first film FI1 disposed on the first filling members FM1 may be removed.

Figure 17:
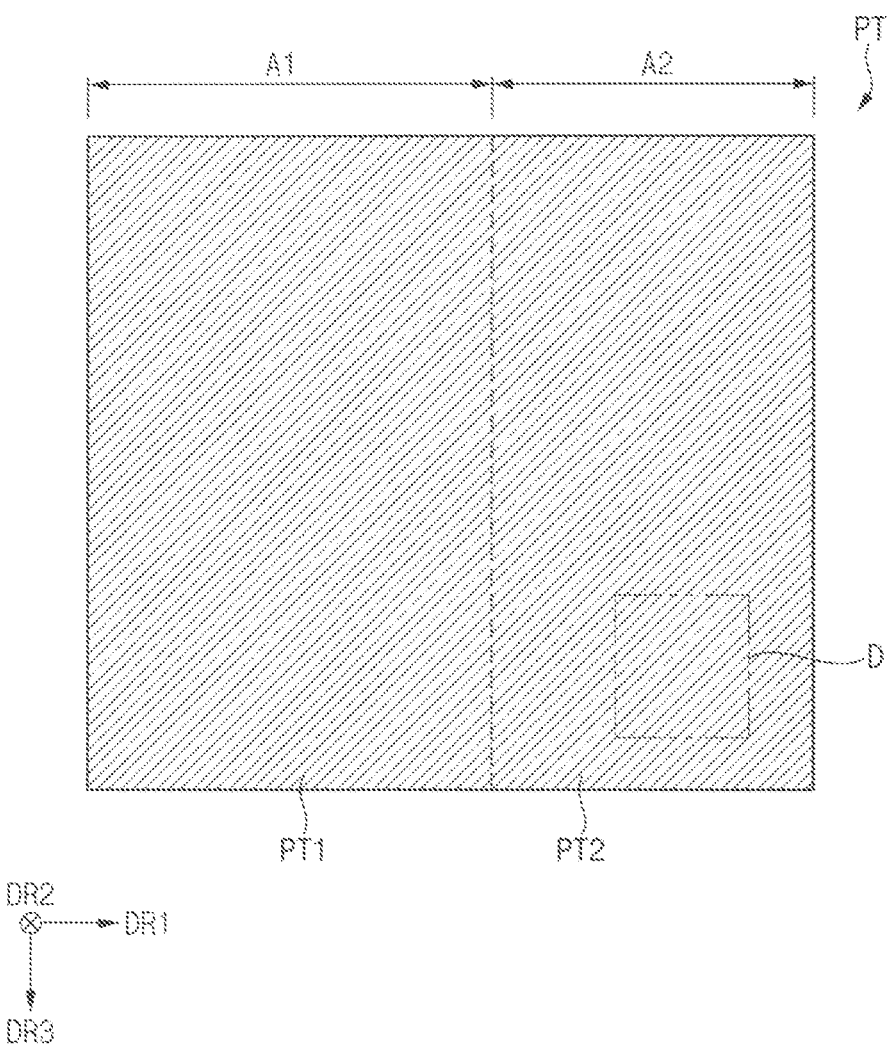
Figure 18:
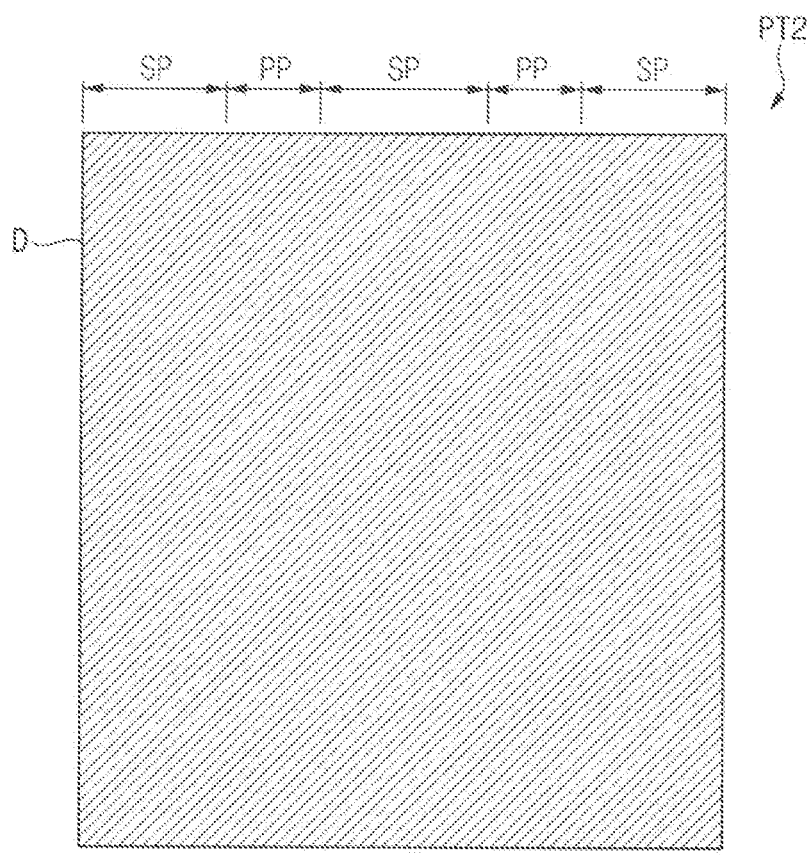
Figure 18:
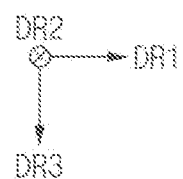
Figure 19:
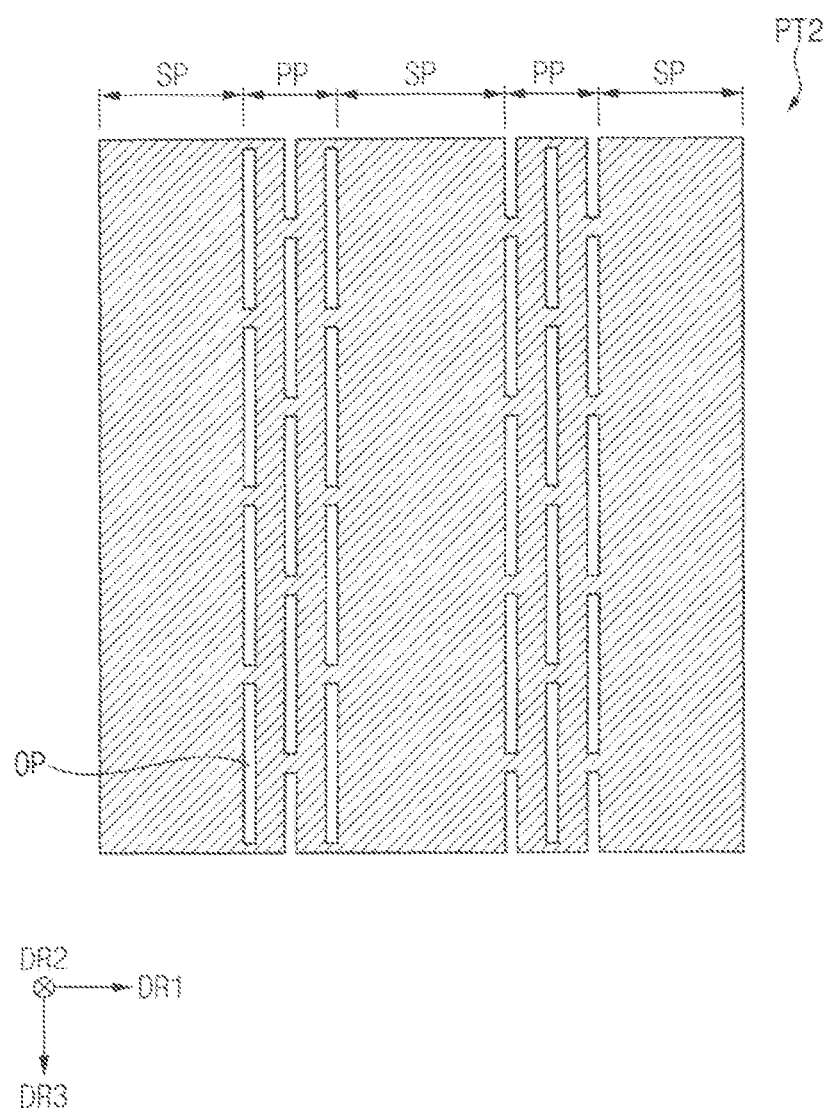

FIG. 18 is a schematic enlarged plan view of area D of FIG. 17, and FIG. 19 is a schematic plan view illustrating a patterned state of the second plate PT2 of FIG. 18.

Referring to FIGS. 17 to 19, a plate PT may be formed. The plate PT may include a first plate PT1 and a second plate PT2 extending from the first plate PT1.

The second plate PT2 may be patterned. For example, opening patterns OP may be formed on the second plate PT2. The opening patterns OP may be formed to be spaced apart from each other at distances (e.g., predetermined or selectable distances).

The second plate PT2 may include pattern portions PP in which the opening patterns OP are formed and segment portions SP respectively disposed between the pattern portions PP.

Figure 20:
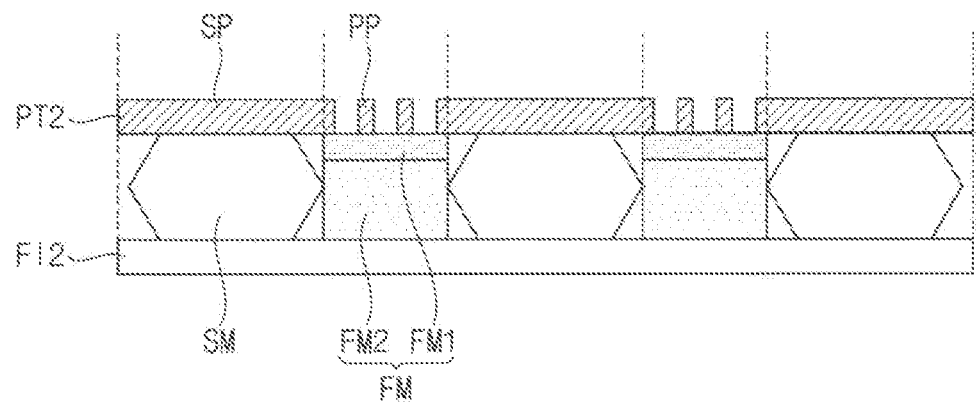

Referring to FIG. 20, the plate PT may be disposed on the segment members SM and the first filling members FM1.

The plate PT may be disposed such that the second plate PT2 overlaps the segment members SM and the first filling members FM1.

The second plate PT2 may be disposed such that the opening patterns OP respectively overlap the first filling members FM1. For example, the second plate PT2 may be disposed such that the pattern portions PP respectively overlap the first filling members FM1.

The first filling members FM1 may respectively overlap the pattern portions PP, and may be respectively attached to bottom surfaces of the pattern portions PP. The segment members SM may respectively overlap the segment portions SP, and may be respectively attached to bottom surfaces of the segment portions SP. The first filling members FM1 may be attached to the pattern portions PP using an adhesive layer, and the segment members SM may be attached to the segment portions SP. However, embodiments according to the disclosure are not limited thereto.

Figure 21:
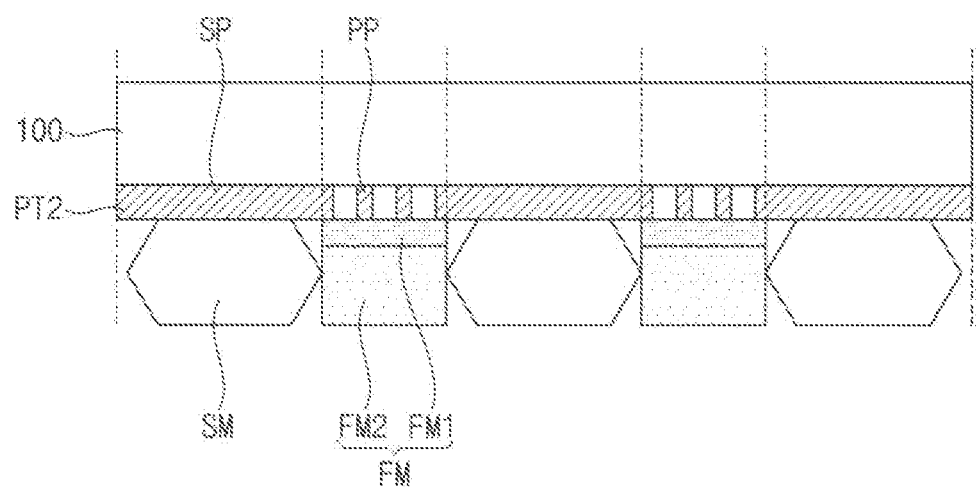

Referring to FIG. 21, the display module 100 may be disposed on the plate PT. In the display module 100, a display panel PNL may be formed on a protective film PF, a window WD may be formed on the display panel PNL, and a protective layer PL may be formed on the window WD. Also, the second film FI2 may be removed from the display device 10.

FIG. 22 is a schematic plan view of a display device according to an embodiment. FIG. 23 is a schematic cross-sectional view taken along line IV-IV' of FIG. 22.

FIG. 22 is a schematic view illustrating another example of FIG. 1. Accordingly, in the display device 11 described with reference to FIG. 22, the substantially same configuration as the display device 10 described with reference to FIG. 1 may be omitted.

Referring to FIGS. 22 and 23, the display device 11 may include a first area A1, a second area A2, and a third area A3. The first area A1, the second area A2, and the third area A3 may be display areas displaying an image. However, the disclosure is not limited thereto, and the first area A1, the second area A2, and the third area A3 may partially display an image.

The first area A1 may be an area exposed to the outside and may have a flat shape. The second area A2 and the third area A3 may be flexible, and may be areas exposed to the outside or accommodated inside as the display device 11 slides. Each of the second area A2 and the third area A3 may have a flat shape when exposed to the outside, and may have a curved shape when accommodated inside.

Each of the second area A2 and the third area A3 may surround at least one side of the first area A1. For example, the second area A2 and the third area A3 may be located adjacent to opposite sides of the first area A1, respectively. However, embodiments according to the disclosure are not limited thereto.

In case that the display device 11 is slid, the area of each of the second area A2 and the third area A3 may change. In case that the display device 11 is unfolded by sliding, the area of each of the second area A2 and the third area A3 may increase (see FIG. 4), and in case that the display device 11 is rolled up by sliding, the area of each of the second area A2 and the third area A3 may decrease (see FIG. 3). The second area A2 and the third area A3 may move independently from each other. Accordingly, only the area of the second area A2 may increase or decrease, and only the area of the third area A3 may increase or decrease.

The display device 11 may include a display module 100 and a lower structure 200. The lower structure 200 may include a plate PT, a flat bar FB, and a multi joint module MJM.

The display module 100 may include a flat portion FP and a bendable portion BP. The flat portion FP may be a portion overlapping the first area A1 in the display module 100. The flat portion FP may be an area exposed to the outside and may have a flat shape.

The bendable portion BP may be a portion overlapping the second area A2 and the third area A3 of the display module 100. For example, the bendable portion BP may include a first bendable portion BP1 overlapping the second area A2 and a second bendable portion BP2 overlapping the third area A3.

The first bendable portion BP1 and the second bendable portion BP2 may be flexible. The first bendable portion BP1 may extend from the flat portion FP in the first direction DR1. The second bendable portion BP2 may extend in a direction opposite to the first direction DR1 from the flat portion FP. Each of the first bendable portion BP1 and the second bendable portion BP2 may be a portion exposed to the outside or accommodated inside as the display device 11 slides.

The plate PT may be disposed under the display module 100 in the second direction DR2. As the display device 11 includes the first area A1, the second area A2, and the third area A3, the plate PT may also include the first area A1, the second area A2 and the third area A3.

In an embodiment, the plate PT may include the first plate PT1, the second plate PT2, and the third plate PT3.

The first plate PT1 may overlap the first area A1 and may overlap the flat portion FP of the display module 100. For example, the flat portion FP may be disposed on the first plate PT1.

The second plate PT2 may extend from the first plate PT1 in the first direction DR1. The second plate PT2 may overlap the second area A2 and may overlap the first bendable portion BP1 of the display module 100.

The third plate PT3 may extend from the first plate PT1 in a direction opposite to the first direction D1. However, embodiments according to the disclosure are not limited thereto. The third plate PT3 may overlap the third area A3 and may overlap the second bendable portion BP2 of the display module 100.

The second plate PT2 and the third plate PT3 may be flexible. The second plate PT2 and the third plate PT3 may be exposed to the outside or accommodated inside as the display device 11 slides.

The flat bar FB may be disposed under the first plate PT1. The flat bar FB may overlap the first area A1 and the flat portion FP of the display module 100. The flat bar FB may have a hollow flat rectangular parallelepiped shape. However, the shape of the flat bar FB according to the embodiments of the disclosure is not limited thereto.

The flat bar FB and the adjacent multi joint module MJM may be a same thickness. However, the thickness of the flat bar FB according to the embodiments of the disclosure may be smaller than the thickness of the multi joint module MJM.

In an embodiment, the display device 11 may include at least one multi joint module MJM. For example, the display device 11 may include two multi joint modules MJM. The multi joint module MJM may include a first multi joint module MJM1 disposed under the second plate PT2 and a second multi joint module MJM2 disposed under the third plate PT3.

The first multi joint module MJM1 may overlap the second area A2 and the first bendable portion BP1 of the display module 100. The second multi joint module MJM2 may overlap the third area A3 and the second bendable portion BP2 of the display module 100. The first multi-joint module MJM1 and the second multi-joint module MJM2 may guide the movement of the first bendable portion BP1 and the movement of the second bendable portion BP2, respectively. The first multi-joint module MJM1 and the second multi-joint module MJM2 may respectively move the first bendable portion BP1 and the second bendable portion BP2 of the display module 100 while maintaining smooth shapes (e.g., which are not deformed to have a convex part or concave part).

The display device and the method according to the embodiments may be applied to a display device included in a computer, a laptop, a mobile phone, a smartphone, a smart pad, a PMP, a PDA, an MP3 player, or the like.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
    a plate including:
        a first area; and
        a second area adjacent to the first area and including:
            pattern portions defining an opening pattern; and
            segment portions disposed between the pattern portions, respectively;
    a display module including:
        a flat portion disposed in the first area on the plate; and
        a bendable portion extending from the flat portion and disposed in the second area on the plate;
    segment members disposed in the second area under the plate and respectively overlapping the segment portions in a direction;
    first filling members disposed under the plate, disposed between the segment members, respectively overlapping the pattern portions in the direction, and having a first elastic modulus; and
    second filling members respectively disposed under the first filling members, respectively overlapping the first filling members in the direction, and having a second elastic modulus different from the first elastic modulus.

2. The display device of claim 1, wherein the first elastic modulus is greater than the second elastic modulus.

3. The display device of claim 2, wherein
    the first elastic modulus is more than about 3 GPa, and
    the second elastic modulus is less than about 1 GPa.

4. The display device of claim 1, wherein the segment members are spaced apart from each other by a distance.

5. The display device of claim 4, wherein
    the segment members respectively contact the segment portions, and
    the first filling members respectively contact the pattern portions.

6. The display device of claim 1, wherein a thickness of each of the first filling members in the direction is less than a thickness of each of the second filling members in the direction.

7. The display device of claim 6, wherein
each of the segment members includes at least one protrusion protruding in another direction parallel to the plate, and
the direction and the another direction intersect each other.

8. The display device of claim 7, wherein the at least one protrusion does not overlap the first filling members in the another direction.

9. The display device of claim 7, wherein
a length from a lower surface of the plate to the at least one protrusion in the direction is greater than the thickness of each of the first filling members in the direction.

10. The display device of claim 1, wherein each of the first filling members and each of the second filling members include different materials from each other.

11. The display device of claim 10, wherein each of the first filling members includes at least one of polyurethane and thermoplastic polyurethane.

12. The display device of claim 10, wherein each of the second filling members includes at least one of polyethylene and acryl.

* * * * *